United States Patent
Ke

(10) Patent No.: US 11,301,098 B2
(45) Date of Patent: Apr. 12, 2022

(54) FLEXIBLE TOUCH SENSOR AND FLEXIBLE TOUCH DISPLAY MODULE

(71) Applicant: TPK Advanced Solutions Inc., Fujian (CN)

(72) Inventor: Yongbin Ke, Xiamen (CN)

(73) Assignee: TPK Advanced Solutions Inc., Xiamen (CN)

( * ) Notice: Subject to any disclaimer, the term of this patent is extended or adjusted under 35 U.S.C. 154(b) by 0 days.

(21) Appl. No.: 16/987,447

(22) Filed: Aug. 7, 2020

(65) Prior Publication Data

US 2022/0043535 A1     Feb. 10, 2022

(51) Int. Cl.
| | |
|---|---|
| G06F 3/044 | (2006.01) |
| G06F 3/041 | (2006.01) |
| H05K 1/18 | (2006.01) |
| H05K 9/00 | (2006.01) |

(52) U.S. Cl.
CPC .......... *G06F 3/0444* (2019.05); *G06F 3/0412* (2013.01); *H05K 1/189* (2013.01); *H05K 9/0009* (2013.01); *G06F 2203/04102* (2013.01); *G06F 2203/04107* (2013.01)

(58) Field of Classification Search
CPC .............. G06F 1/18; G06F 3/041–047; G06F 2203/041–04114; H05K 9/009; H05K 2201/026; H05K 2201/0257; H05K 9/0081; G02F 1/133334; G02F 1/13338; G02F 1/136218

See application file for complete search history.

(56) References Cited

U.S. PATENT DOCUMENTS

| | | | |
|---|---|---|---|
| 2008/0143906 A1* | 6/2008 | Allemand | B82Y 30/00 349/43 |
| 2011/0157762 A1* | 6/2011 | Kurashima | G06F 3/0446 361/277 |
| 2012/0326992 A1* | 12/2012 | Yeh | G06F 3/0445 345/173 |
| 2013/0057495 A1* | 3/2013 | Wang | G06F 3/0446 345/173 |
| 2015/0055031 A1 | 2/2015 | Yang | |
| 2018/0088717 A1 | 3/2018 | Chen et al. | |
| 2018/0166507 A1 | 6/2018 | Hwang et al. | |
| 2020/0089347 A1* | 3/2020 | Baek | G06F 3/04164 |

FOREIGN PATENT DOCUMENTS

| | | |
|---|---|---|
| CN | 209281368 U | 8/2019 |
| CN | 111459320 A | 7/2020 |
| TW | 201205149 A | 2/2012 |
| TW | 201545006 A | 12/2015 |
| TW | 201610796 A | 3/2016 |

* cited by examiner

*Primary Examiner* — Sanjiv D. Patel
(74) *Attorney, Agent, or Firm* — Cooper Legal Group, LLC

(57) ABSTRACT

A flexible touch sensor having a visible area and a trace area surrounding the visible area includes a substrate, a touch-sensing layer, and a noise shielding layer. The substrate has a first surface and a second surface facing away from the first surface. The touch-sensing layer is disposed on the first surface of the substrate. The noise shielding layer is disposed on the second surface of the substrate. The noise shielding layer includes a matrix and a plurality of metal nanowires distributed in the matrix.

20 Claims, 12 Drawing Sheets

FLEXIBLE TOUCH SENSOR AND FLEXIBLE TOUCH DISPLAY MODULE

BACKGROUND

Field of Disclosure

The present disclosure relates to a flexible touch sensor, and particularly relates to a flexible touch sensor having a noise shielding layer and a flexible touch display module integrated with the above flexible touch sensor.

Description of Related Art

In recent years, touch panels have been widely used in portable electronic products such as mobile phones, notebook computers, satellite navigation systems, and digital audio-visual players to serve as information communication channels between users and electronic devices. Based on touch principle, the touch panels can be divided into two types: resistive touch panels and capacitive touch panels. Generally speaking, the resistive touch panel is made up of two sets of transparent conductive films. The two sets of transparent conductive films are conducted to each other by pressing, and the voltage change is measured to further calculate the pressing position. The capacitive touch panel utilizes the capacitance change generated by the electrostatic combination between the transparent electrode and the user to calculate the pressing position. With the development of the panel industry, the capacitive touch panels gradually replace the resistive touch panels.

As demand for the touch panels gradually increases, dealers have begun to actively develop flexible touch panels having flexibility. The touch positioning of the flexible touch panels can be implemented based on the principles of the capacitive touch panel. Generally speaking, the flexibility of the flexible touch panel is often achieved through the selection of materials of each layer therein, the thickness of each layer therein, and the distance between each layer therein. However, when the above characteristics and parameters are adjusted, the performance of the flexible touch panel is often affected. Therefore, how to maintain or improve the performance and reliability of the flexible touch panel under the premise of having good flexibility has become an important issue in the related fields.

SUMMARY

According to some embodiments of the present disclosure, a flexible touch sensor having a visible area and a trace area surrounding the visible area includes a substrate, a touch-sensing layer, and a noise shielding layer. The substrate has a first surface and a second surface facing away from the first surface. The touch-sensing layer is disposed on the first surface of the substrate. The noise shielding layer is disposed on the second surface of the substrate. The noise shielding layer includes a matrix and a plurality of metal nanowires distributed in the matrix.

In some embodiments of the present disclosure, a thickness of the noise shielding layer is between 30 nm and 50 nm.

In some embodiments of the present disclosure, a thickness of the substrate is between 5 μm and 30 μm.

In some embodiments of the present disclosure, the touch-sensing layer includes a conductive electrode layer and a trace. The conductive electrode layer is correspondingly disposed in the visible area and has a single-layer electrode structure. The trace is correspondingly disposed in the trace area and electrically connected to the conductive electrode layer.

In some embodiments of the present disclosure, the touch-sensing layer includes a first conductive electrode layer, a second conductive electrode layer, and an insulating layer. The first conductive electrode layer is correspondingly disposed in the visible area. The second conductive electrode layer is correspondingly disposed in the visible area and on the first surface of the substrate. The insulating layer is disposed between the first conductive electrode layer and the second conductive electrode layer. The first conductive electrode layer, the second conductive electrode layer, and the insulating layer are disposed on a same side of the substrate.

In some embodiments of the present disclosure, the touch-sensing layer further includes a trace correspondingly disposed in the trace area and on the first surface of the substrate to be electrically connected to the first conductive electrode layer and the second conductive electrode layer.

In some embodiments of the present disclosure, the touch-sensing layer includes a first conductive electrode layer and a second conductive electrode layer. The first conductive electrode layer is correspondingly disposed in the visible area and on the first surface of the substrate. The second conductive electrode layer is correspondingly disposed in the visible area, on the second surface of the substrate, and between the substrate and the noise shielding layer.

In some embodiments of the present disclosure, the touch-sensing layer further includes a first trace and a second trace. The first trace is correspondingly disposed in the trace area and on the first surface of the substrate to be electrically connected to the first conductive electrode layer. The second trace is correspondingly disposed in the trace area and on the second surface of the substrate to be electrically connected to the second conductive electrode layer.

In some embodiments of the present disclosure, the flexible touch sensor further includes a carrier. The noise shielding layer is disposed on a surface of the carrier, and the carrier or the noise shielding layer is disposed on the second surface of the substrate through an adhesive layer.

In some embodiments of the present disclosure, a total laminated thickness of the carrier and the noise shielding layer is between 5 μm and 10 μm.

In some embodiments of the present disclosure, the flexible touch sensor further includes a flexible circuit board electrically connected to the touch-sensing layer and the noise shielding layer.

In some embodiments of the present disclosure, the flexible touch sensor further includes a conductive coil correspondingly disposed in the trace area and on a surface of the noise shielding layer. The conductive coil is directly in contact with the noise shielding layer and electrically connected to the flexible printing board.

According to some other embodiments of the present disclosure, a flexible touch display module includes a flexible display panel and any of the above flexible touch sensors disposed on the flexible display panel.

In some embodiments of the present disclosure, the flexible touch display module further includes a cover glass disposed on the flexible touch sensor, in which a thickness of the flexible touch sensor is between 50 μm and 125 μm.

In some embodiments of the present disclosure, the flexible touch display module further includes a polarizing layer disposed between the flexible display panel and the flexible touch sensor or between the flexible touch sensor and the cover glass.

In the aforementioned embodiments of the present disclosure, the flexible touch sensor is designed to include the noise shielding layer, and the flexible touch display module is integrated with the above flexible touch sensor, such that the noise shielding layer is disposed between the flexible display panel and the touch-sensing layer. Since the noise shielding layer includes the matrix and the metal nanowires distributed in the matrix, the noise shielding layer can be bent, and the conductivity of the noise shielding layer will not be affected after multiple times of bending, thereby maintaining a good noise shielding effect to avoid the noise interference between the flexible display panel and the touch-sensing layer and improving the report rate and the touch-response speed of the flexible touch sensor. In addition, through the configuration of the noise shielding layer, the thickness of each layer in the flexible touch display module can be reduced, thereby improving the flexibility and the lightness of the flexible touch display module.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
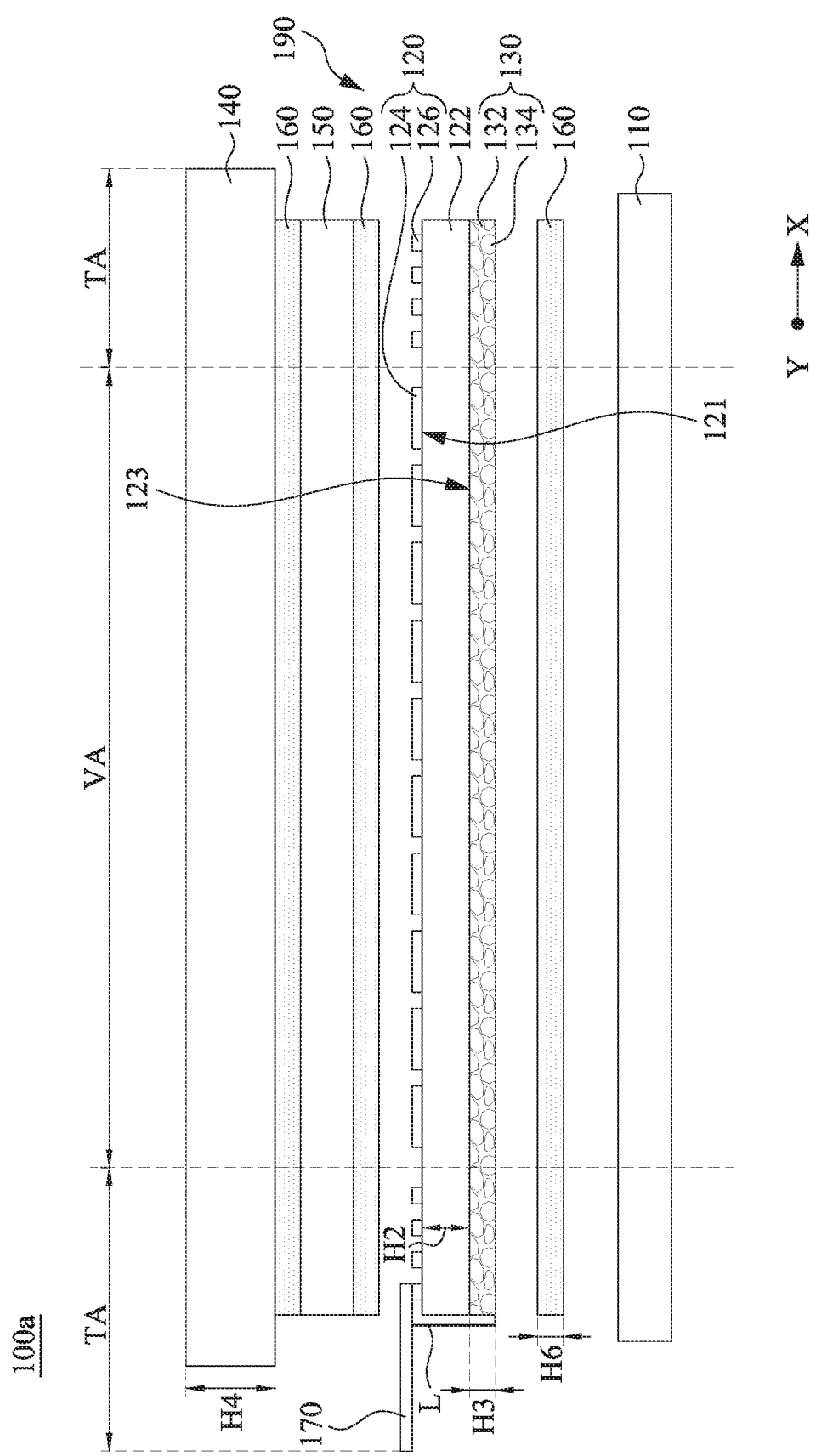
FIGS. 1A to 1D are cross-sectional views illustrating flexible touch display modules according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In addition, relative terms such as "lower" or "bottom" and "upper" or "top" can be used herein to describe the relationship between one element and another element, as shown in the figure. It should be understood that relative terms are intended to include different orientations of the device other than those shown in the figures. For example, if the device in one figure is turned over, elements described as being on the "lower" side of other elements will be oriented on the "upper" side of the other elements. Therefore, the exemplary term "lower" may include an orientation of "lower" and "upper", depending on the specific orientation of the drawing. Similarly, if the device in one figure is turned over, elements described as "below" other elements will be oriented "above" the other elements. Therefore, the exemplary term "below" can include an orientation of "above" and "below".

The present disclosure provides a flexible touch sensor having a noise shielding layer and a flexible touch display module integrated with the above flexible touch sensor. Among them, the noise shielding layer can prevent the noise interference between the flexible display panel and the touch-sensing layer, thereby improving the report rate and the touch-response speed of the flexible touch display module.

FIGS. 1A to 1D are cross-sectional views illustrating flexible touch display modules 100a-100d according to some embodiments of the present disclosure. It should be understood that, for the sake of clarity, some of the layers in the flexible touch display modules 100a-100d of FIGS. 1A-1D are illustrated as being separated from each other. However, the layers in the flexible touch display modules 100a-100d may actually be in direct or indirect contact with each other and closely stacked, and this is the case in all of the subsequent drawings. Please first refer to FIG. 1A. The flexible touch display module 100a includes a flexible display panel 110, a touch-sensing layer 120, a substrate 122, a noise shielding layer 130, and a cover glass 140, in which the touch-sensing layer 120, the substrate 122, and the noise shielding layer 130 can be constructed as a flexible touch sensor 190 to provide a touch-sensing function.

In some embodiments, the flexible touch sensor 190 has a visible area VA and a trace area TA surrounding the visible area VA (e.g., horizontally surrounding the visible area VA). The substrate 122 has a first surface 121 and a second surface 123 facing away from the first surface 121. The touch-sensing layer 120 is disposed on the first surface 121 of the substrate 122. The noise shielding layer 130 is disposed on the second surface 123 of the substrate 122, in which the noise shielding layer 130 may include a matrix 132 and a plurality of metal nanowires (also referred to as metal nanostructures) 134 distributed in the matrix 132. In some embodiments, the matrix 132 may include polymers or a mixture thereof, thereby giving specific chemical, mechanical, and optical properties to the metal nanowires 134. For example, the matrix 132 can provide good adhesion between the metal nanowires 134 and the substrate 122. For another example, the matrix 132 can provide the metal nanowires 134 with good mechanical strength. In some embodiments, the matrix 132 includes a specific polymer, such that the metal nanowires 134 have additional surface protection against scratches and abrasion, thereby enhancing the surface strength of the noise shielding layer 130. The above specific polymer may be, for example, polyacrylate, epoxy resin, polyurethane, poly (silicon-acrylic acid), polysiloxane, polysilane, or combinations thereof. In some embodiments, the matrix 132 may further include crosslinking agents, polymerization inhibitors, stabilizers (e.g., including but not limited to antioxidants or ultraviolet light stabilizers), surfactants, or combinations thereof, thereby improving the anti-ultraviolet property of the noise shielding layer 130 and prolonging the service life of the noise shielding layer 130.

In some embodiments, the metal nanowires 134 may include, but are not limited to, silver nanowires, gold nanowires, copper nanowires, nickel nanowires, or combinations thereof. Furthermore, the term "metal nanowires 134" used herein is a collective term that refers to a collection of metal wires including multiple metal elements, metal alloys, or metal compounds (including metal oxides). In addition, the number of metal nanowires 134 included in the noise shielding layer 130 is not intended to limit the present disclosure. Since the metal nanowires 134 of the present disclosure have excellent light transmittance, the metal nanowires 34 can provide the noise shielding layer 130 with a good noise shielding effect without affecting its optical properties.

In some embodiments, a cross-sectional size (e.g., a diameter of the cross-section) of a single metal nanowire 134 can be less than 500 nm, preferably less than 100 nm, and more preferably less than 50 nm. In some embodiments, the metal nanowire 134 has a large aspect ratio (length: diameter). Specifically, the aspect ratio of the metal nanowire 134 may be between 10 and 100000. In more detail, the aspect ratio of the metal nanowire 134 may be greater than 10, preferably greater than 50, and more preferably greater than 100. In addition, other terms such as silk, fiber, or tube (e.g., carbon nanotube) also have the aforementioned cross-sectional dimensions and aspect ratios, and are also covered by the present disclosure.

In some embodiments, the noise shielding layer 130 may be formed by dispersing fluid including the metal nanowires 134 through the steps of coating, curing, and drying. In some embodiments, the dispersing fluid includes a solvent, thereby uniformly dispersing the metal nanowires 134 therein. Specifically, the solvent is, for example, water, alcohols, ketones, ethers, hydrocarbons, aromatic solvents (benzene, toluene, xylene, etc.), or combinations thereof. In some embodiments, the dispersing fluid may further include additives, surfactants, and/or binders to improve the compatibility between the metal nanowires 134 and the solvent and to improve the stability of the metal nanowires 134 in the solvent. Specifically, the additives, surfactants, and/or binders can be, for example, carboxymethyl cellulose (CMC), hydroxyethyl cellulose (HEC), hydroxypropyl methylcellulose (HPMC), fluorine-containing surfactant, sulfosuccinate sulfonate, sulfate, phosphate, disulfonate, or combinations thereof.

In some embodiments, the coating step may include, but is not limited to, processes such as screen printing, nozzle coating, or roller coating. In some embodiments, a roll to roll process may be performed to uniformly coat the dispersing liquid including the metal nanowires 134 on the second surface 123 of the continuously supplied substrate 122. In some embodiments, the curing and drying steps can make the solvent volatilize, causing the metal nanowires 134 to be randomly distributed on the second surface 123 of the substrate 122. In preferred embodiments, the metal nanowires 134 can be fixed on the second surface 123 of the substrate 122 without falling off, and the metal nanowires 134 can be in contact with each other to provide a continuous current path, thereby forming a conductive network to provide a good noise shielding effect.

In some embodiments, an overcoat (OC) layer can be further coated on the metal nanowires 134 fixed on the second surface 123 of the substrate 122, and cured to form a composite structure layer together with the metal nanowires 134. In other words, the cured overcoat layer is the matrix 132 of the present disclosure, and the composite structure layer is the noise shielding layer 130 of the present disclosure. In detail, the aforementioned polymers or the mixture thereof may be formed on the metal nanowires 134 by coating, and the polymers or the mixture thereof may then be infiltrated between the metal nanowires 134 to form filler and then be cured to form the matrix 132. In this way, the metal nanowires 134 can be embedded in the matrix 132. In some embodiments, heating and baking may be performed, such that the overcoat layer including the aforementioned polymers or the mixture thereof can be formed into the matrix 132. In some embodiments, the temperature of heating and baking may be between 60° C. and 150° C. It should be understood that the physical structure between the substrate 122 and the metal nanowires 134 is not intended to limit the present disclosure. In some embodiments, the matrix 132 and the metal nanowires 134 may be a stack of two layers. In other embodiments, the matrix 132 and the metal nanowires 134 may be mixed with each other to form the composite structure layer. In preferred embodiments, the metal nanowires 134 are embedded in the matrix 132 to form the composite structure layer.

In some embodiments, the metal nanowires 134 may be further subjected to post-treatment to increase their conductivity. The post-treatment includes, but is not limited to, steps of heating, plasma providing, corona discharging, ultraviolet providing, ozone providing, or pressurizing. In some embodiments, one or more rollers may be utilized to apply pressure to the metal nanowires 134. In some embodiments, the applied pressure may be between 50 psi and 3400 psi. In some embodiments, the post-treatment of the heating step and the pressurizing step may be performed on the metal nanowires 134 at the same time. In some embodiments, the temperature of the one or more rollers may be heated to between 70° C. and 200° C. In preferred embodiments, the metal nanowires 134 may be exposed to a reducing agent for the post-treatment. For example, when the metal nanowires 134 are silver nanowires, and the metal nanowires 134 can be exposed to a silver reducing agent for the post-treatment. In some embodiments, the silver reducing agent may include a borohydride such as sodium borohydride, a boron nitrogen compound such as dimethylamine borane (DMAB), or a gas reducing agent such as hydrogen. Furthermore, in some embodiments, the exposure time may be between 10 seconds and 30 minutes.

In some embodiments, the noise shielding layer 130 may cover the entire second surface 123 of the substrate 122; that is, a vertical projection of the noise shielding layer 130 on the flexible display panel 110 may entirely overlap a vertical projection of the touch-sensing layer 120 on the flexible display panel 110. In some embodiments, the noise shielding layer 130 can be arranged to avoid other elements (not shown, such as antennas, etc.) on the second surface 123 of the substrate 122. In some embodiments, a thickness H3 of the noise shielding layer 130 may be between 30 nm and 50 nm, so as to provide good noise shielding effect, flexibility, and lightness for the flexible touch sensor 190. In more detail, if the thickness H3 of the noise shielding layer 130 is less than 30 nm, the noise shielding layer 130 may not have a good noise shielding effect; and if the thickness H3 of the noise shielding layer 130 is greater than 50 nm, the flexibility of the entire flexible touch sensor 190 may be affected, causing the flexible touch display module 100a to be difficult to bend or easily broken while bending.

In some embodiments, the flexible touch sensor 190 may, for example, adopt the capacitive touch-sensing technology, in which the touch-sensing layer 120 may include a conductive electrode layer 124 and a plurality of traces 126 disposed on the first surface 121 of the substrate 122. The conductive electrode layer 124 is correspondingly disposed in the visible area VA, and the traces 126 are correspondingly disposed in the trace area TA and electrically connected to the conductive electrode layer 124. In some embodiments, the conductive electrode layer 124 may be designed as, for example, an electrode layer of a single-layer electrode structure or a bridge-type single-layer electrode structure. In addition, the material of the conductive electrode layer 124 may include a transparent conductive material, such as, but not limited to, nanometal, indium tin oxide (ITO), indium zinc oxide (IZO), antimony tin oxide (ATO), antimony zinc oxide (AZO), carbon nanotubes, graphene, or other suitable transparent conductive materials.

In some embodiments, the flexible touch sensor 190 may further include a flexible circuit board 170, and the conductive electrode layer 124 may be electrically connected to the flexible circuit board 170 through the traces 126 to further connect to external circuit elements, thereby transmitting the sensing signal of the touch-sensing layer 120 to external integrated circuits for subsequent processing. On the other hand, the noise shielding layer 130 can also be electrically connected to the flexible circuit board 170 through a wire L, so as to vent the noise signals or provide a stable ground signal through the flexible circuit board 170.

There should be an additional remark that, in some embodiments, the noise shielding layer 130 is directly formed on the second surface 123 of the substrate 122. In some other embodiments, the flexible touch sensor 190 may further include a carrier (not shown), and the noise shielding layer 130 is first formed on a surface of the carrier, and then the carrier having the noise shielding layer 130 formed thereon is further attached to the second surface 123 of the substrate 122 through an adhesive layer (not shown). In some embodiments, the carrier having the noise shielding layer 130 formed thereon may be attached to the second surface 123 of the substrate 122 from a surface of the carrier or a surface of the noise shielding layer 130 through the adhesive layer.

In terms of the entire flexible touch display module 100a, the flexible touch sensor 190 is disposed on the flexible display panel 110, in which the noise shielding layer 130 is disposed on the second surface 123 of the substrate 122 to face toward the flexible display panel 110, such that the noise shielding layer 130 is between the flexible display panel 110 and the touch-sensing layer 120. As a result, the noise shielding layer 130 can effectively avoid the noise interference between the flexible display panel 110 and the touch-sensing layer 120, thereby improving the report rate and the touch-response speed of the flexible touch display module 100a. In addition, the cover glass 140 is disposed on the flexible touch sensor 190 to provide protection for the flexible touch sensor 190 and the flexible display panel 110. In the entire laminated structure, the noise shielding layer 130, the substrate 122, the touch-sensing layer 120, and the cover glass 140 are sequentially stacked on the flexible display panel 110.

In some embodiments, the flexible display panel 110 may be, for example, an organic light emitting diode (OLED) panel. In some embodiments, the substrate 122 and the cover glass 140 may respectively include flexible materials having flexibility, which refers to materials having certain strength and certain flexibility in the industry. For example, such materials may include polyimide (PI), polycarbonate (PC), polyvinyl chloride (PVC), polystyrene (PS), polyether sulfide (PES), polyester (PE), polyamide amine (PA), polybutene (PB), polyethylene (PE), polymethyl methacrylate (PMMA), polybutylene terephthalate (PBT), polyethylene terephthalate (PET), polyether ether ketone (PEEK), polyurethane (PU), polyether imide (PEI), polytetrafluoroethylene (PTFE), acrylic, or combinations thereof. In some embodiments, a thickness H2 of the substrate 122 may be between 5 μm and 30 μm, and a thickness H4 of the cover glass 140 may be between 50 μm and 125 μm, so as to provide the flexible touch display module 100a with good flexibility and lightness. In detail, if the thickness H2 of the substrate 122 is greater than 30 μm, the flexibility of the substrate 122 may be affected, and if the thickness H4 of the cover glass 140 is greater than 125 μm, the flexibility of the cover glass 140 may be affected, causing the flexible touch display module 100a to be difficult to bend or easily broken while bending.

In some embodiments, the flexible touch display module 100a may further include a polarizing layer 150, specifically, for example, a liquid crystal coated polarizing layer. The polarizing layer 150 can be disposed between the flexible touch sensor 190 and the cover glass 140. In some embodiments, the polarizing layer 150 may be directly formed on a surface of the cover glass 140; that is, the polarizing layer 150 is formed by utilizing the cover glass 140 as a substrate. In some embodiments, the flexible touch display module 100a may further include a plurality of adhesive layers 160 having flexibility. Specifically, the adhesive layer(s) 160 may be disposed between the polarizing layer 150 and the cover glass 140, between the flexible touch sensor 190 and the polarizing layer 150, and/or between the flexible display panel 110 and the flexible touch sensor 190. However, the present disclosure is not limited in this regard, and the adhesive layer 160 can be disposed between the layers according to actual needs. In some embodiments, the adhesive layer 160 may be, for example, an optical clear adhesive (OCA) with high light transmittance, and furthermore, the adhesive layer 160 may be a liquid optical clear adhesive (LOCA). In some embodiments, a thickness H6 of the adhesive layer 160 may be between 5 μm and 100 μm, so as to provide a good adhesion effect and make the flexible touch display module 100a have good flexibility and lightness. In detail, if the thickness H6 of the adhesive layer 160 is less than 5 μm, the adhesive effect may be weak, which is not conducive to the bonding between the layers in the flexible touch display module 100a; and if the thickness H6 of the adhesive layer 160 is greater than 100 μm, the flexibility of the adhesive layer 160 may be affected, causing the flexible touch display module 100a to be difficult to bend or to have a defected appearance after repeated bending. In preferred embodiments, the thickness H6 of the adhesive layer 160 may be between 5 μm and 25 μm, so as to better possess the above advantages.

Figure 1B:
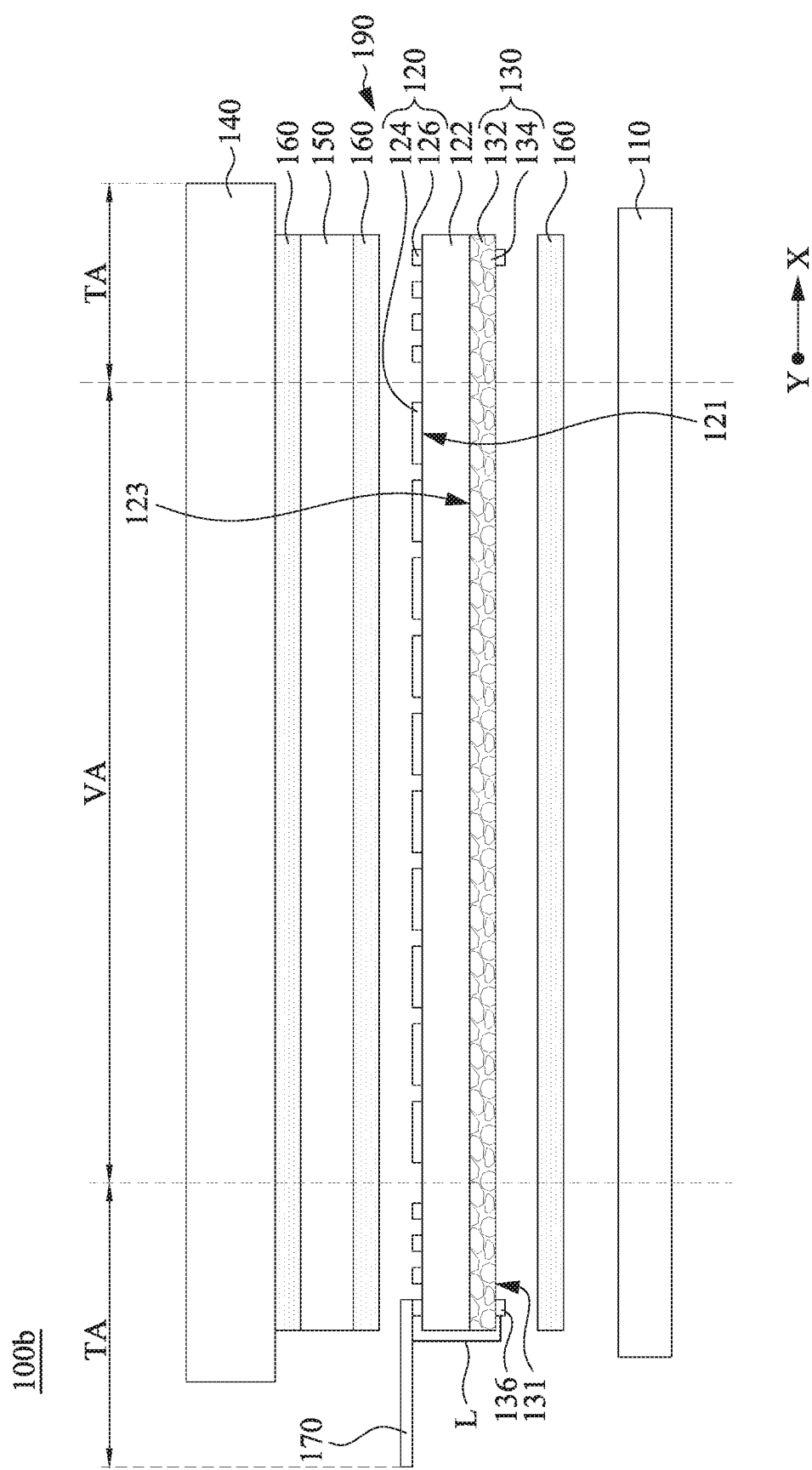
Figure 1C:
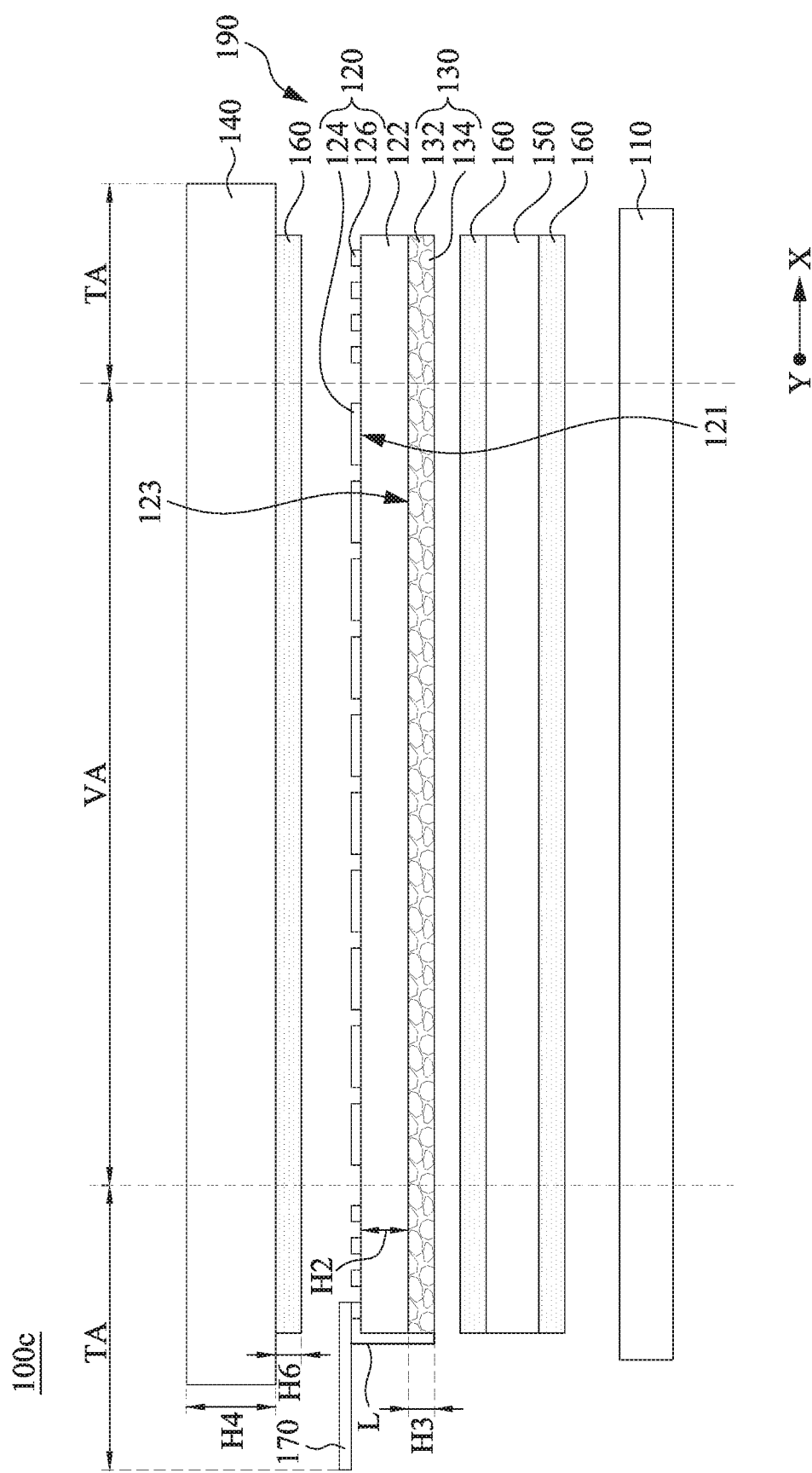

Please then refer to FIG. 1B. At least one difference between the flexible touch display module 100b shown in FIG. 1B and the flexible touch display module 100a shown in FIG. 1A is that the flexible touch display module 100b further includes a conductive coil 136 correspondingly disposed in the trace area TA. The conductive coil 136 is disposed on a surface 131 of the noise shielding layer 130 facing away from the substrate 122 to be directly in contact with the noise shielding layer 130. In addition, the conductive coil 136 is further electrically connected to the flexible circuit board 170 through the wire L and grounded. In some embodiments, the conductive coil 136 may be made of a metal material with better conductivity than the noise shielding layer 130, for example, including but not limited to silver, copper, gold, aluminum, or combinations thereof. Through the above configuration, the noise shielding layer 130 can have a better electrostatic discharge protection effect, thereby providing a better and more stable noise shielding effect.

Please then refer to FIG. 10. At least one difference between the flexible touch display module 100c shown in FIG. 10 and the flexible touch display module 100a shown in FIG. 1A is that the flexible touch sensor 190 (at least including the touch-sensing layer 120, the substrate 122, and the noise shielding layer 130) and the polarizing layer 150 in the flexible touch display module 100c are in different relative positions. Specifically, in the flexible touch display module 100c, the polarizing layer 150 is disposed between the flexible touch sensor 190 and the flexible display panel 110. Furthermore, the noise shielding layer 130 is disposed on the second surface 123 of the substrate 122 and faces toward the polarizing layer 150, such that the noise shielding layer 130 is disposed between the polarizing layer 150 and the touch-sensing layer 120. Through the above configuration, a distance between the flexible touch sensor 190 and the flexible display panel 110 can further be enlarged, thereby reducing the noise interference between the touch-sensing layer 120 and the flexible display panel 110 and better improving the report rate and the touch-response speed of the flexible touch display module 100c.

Figure 1D:
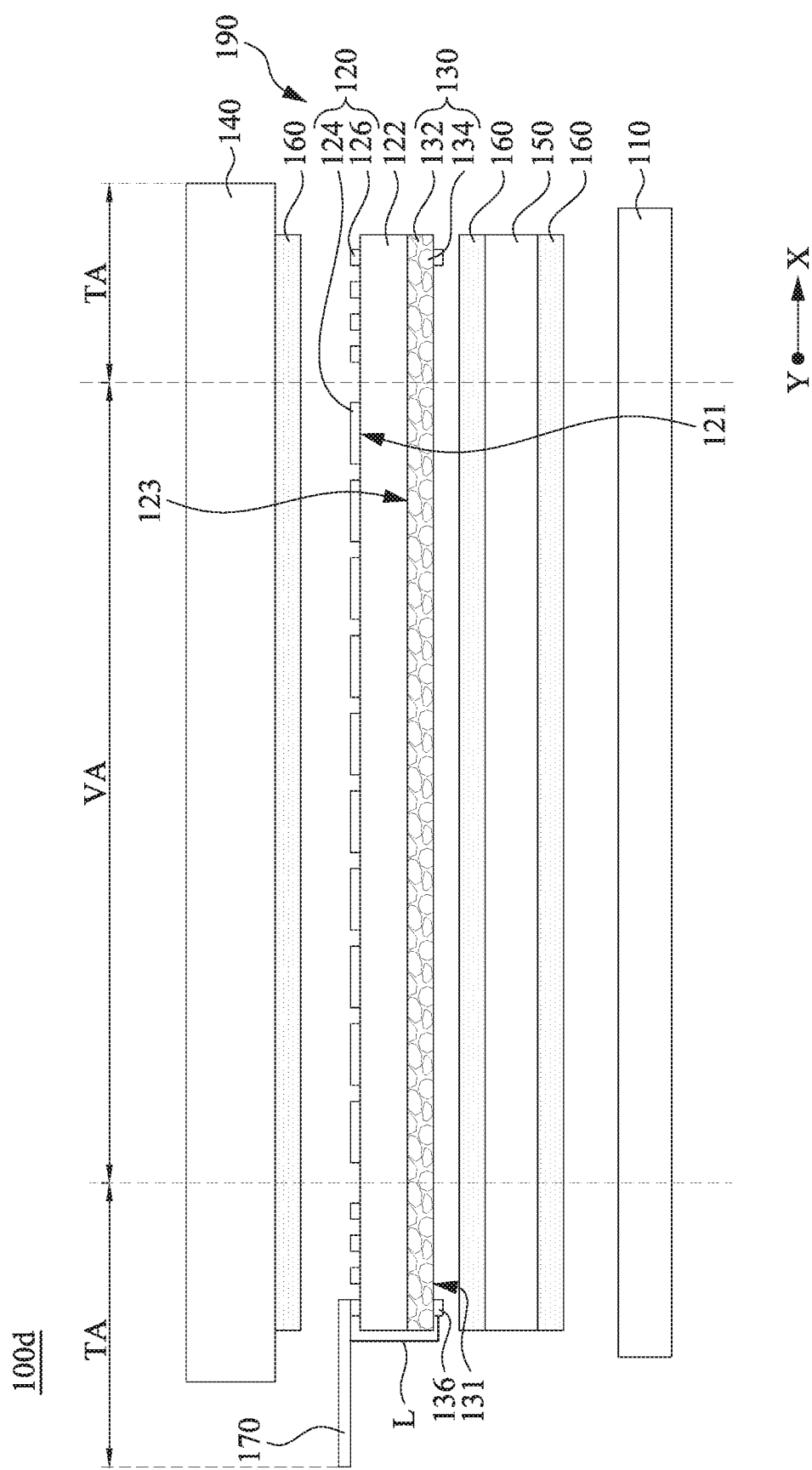

Please refer to FIG. 1D. At least one difference between the flexible touch display module 100d shown in FIG. 1D and the flexible touch display module 100c shown in FIG. 10 is that the flexible touch display module 100d further includes a conductive coil 136 correspondingly disposed in the trace area TA. The conductive coil 136 is disposed on the surface 131 of the noise shielding layer 130 facing away from the substrate 122 to be directly in contact with the noise shielding layer 130. In addition, the conductive coil 136 is further electrically connected to the flexible circuit board 170 through the wire L and grounded. Through the above configuration, the noise shielding layer 130 can have a better electrostatic discharge protection effect, thereby providing a better and more stable noise shielding effect.

FIGS. 2A to 2D are cross-sectional views illustrating flexible touch display modules 200a-200d according to some other embodiments of the present disclosure. The flexible touch display modules 200a-200d in FIGS. 2A to 2D have substantially identical structures as the flexible touch display modules 100a-100d in FIGS. 1A to 1D. At least one difference is that the touch-sensing layers 220 in the flexible touch display modules 200a-200d are respectively designed as double-layer electrode structures, which will be discussed in detail later in the following descriptions. Please first refer to FIG. 2A. The flexible touch display module 200a includes a flexible display panel 210, a touch-sensing layer 220, a substrate 222, a noise shielding layer 230, and a cover glass 240, in which the touch-sensing layer 220, the substrate 222, and the noise shielding layer 230 can be constructed as a flexible touch sensor 290 to provide a touch-sensing function. In terms of the entire flexible touch display module 200a, the flexible touch sensor 290 is disposed on the flexible display panel 210, and the noise shielding layer 230 is disposed on the second surface 223 of the substrate 222 to face toward the flexible display panel 210, such that the noise shielding layer 230 is disposed between the flexible display panel 210 and the touch-sensing layer 220. As such, the noise shielding layer 230 can avoid the noise interference between the flexible display panel 210 and touch-sensing layer 220, thereby improving the report rate and the touch-response speed of the flexible touch display module 200a. In addition, the cover glass 240 is disposed on the flexible touch sensor 290 to provide protection for the flexible touch sensor 290 and the flexible display panel 210. In the entire laminated structure, the noise shielding layer 230, the substrate 222, the touch-sensing layer 220, and the cover glass 240 are sequentially stacked on the flexible display panel 210. It should be understood that the flexible touch display module 200a of FIG. 2A and the flexible touch display module 100a of FIG. 1A have substantially identical component configuration/connection relationships, materials, and advantages, which will not be repeated hereinafter, and only the differences will be discussed in the following descriptions.

In some embodiments, the touch-sensing layer 220 of the double-layer electrode structure may include a first conductive electrode layer 224a, a second conductive electrode layer 224b, a plurality of traces 226, and an insulating layer 228 disposed on a same side of the substrate 222 (e.g., the side of the first surface 221 of the substrate 222). The second conductive electrode layer 224b is disposed on the first surface 221 of the substrate 222, the insulating layer 228 is disposed on a surface of the second conductive electrode layer 224b, and the first conductive electrode layer 224a is disposed on a surface of the insulating layer 228, such that the insulating layer 228 is disposed between the first conductive electrode layer 224a and the second conductive electrode layer 224b. In other words, the first conductive electrode layer 224a and the second conductive electrode layer 224b can be correspondingly disposed in the visible area VA and respectively disposed on opposite surfaces of the insulating layer 228. More specifically, the second conductive electrode layer 224b may be sandwiched between the substrate 222 and the insulating layer 228. In some embodiments, a vertical projection area of the insulating layer 228 on the flexible display panel 210 may be smaller than a vertical projection area of the substrate 222 on the flexible display panel 210.

In some embodiments, the traces 226 may be correspondingly disposed in the trace area TA and on the first surface 221 of the substrate 222 facing toward the cover glass 240, so as to electrically connect the first conductive electrode layer 224a and the second conductive electrode layer 224b. In some embodiments, the second conductive electrode layer 224b and the traces 226 coplanar (e.g., being disposed on a plane formed by the X coordinate axis and the Y coordinate axis) to be electrically connected to each other, and the first conductive electrode layer 224a can penetrate through a conductive via (not shown) of the insulating layer 228 to be electrically connected to the traces 226. In other embodiments, the traces 226 may be a formed as different layers; that is, in addition to being disposed on the first surface 221 of the substrate 222 to be electrically connected to the second conductive electrode layer 224b, the traces 226 may further be disposed on a surface of the insulating layer 228 used to form the first conductive electrode layer 224a, so as to be coplanar with the first conductive electrode layer 224a and electrically connected to the first conductive electrode layer 224a.

In some embodiments, the first conductive electrode layer 224a may be, for example, patterned into a plurality of first-axis (e.g., the X-axis direction, not shown) electrodes insulated from each other, and the second conductive electrode layer 224b may be, for example, patterned into a plurality of second-axis (e.g., the Y-axis direction, not shown) electrodes insulated from each other, in which the first conductive electrode layer 224a and the second conductive electrode layer 224b are electrically insulated from each other through the insulating layer 228. In some embodiments, the flexible touch display module 200a may further include a flexible circuit board 270, and the first conductive electrode layer 224a and the second conductive electrode layer 224b can be electrically connected to the flexible circuit board 270 through the traces 226, so as to be further connected to external circuit elements, thereby transmitting the sensing signal of the touch-sensing layer 220 to external integrated circuits for subsequent processing. On the other hand, the noise shielding layer 230 can also be electrically connected to the flexible circuit board 270 through a wire L, so as to vent the noise signals or provide a stable ground signal through the flexible circuit board 270.

Figure 2A:
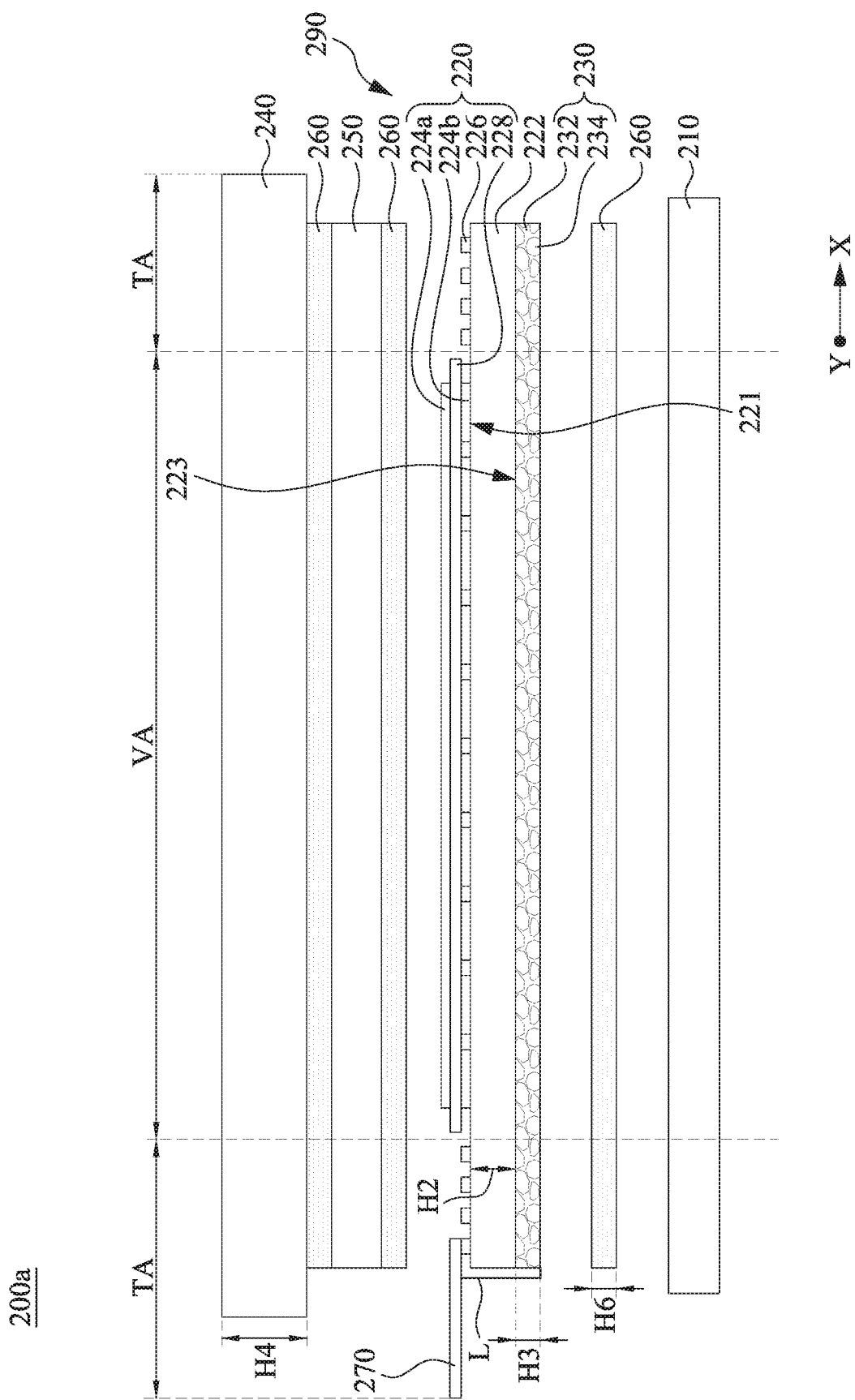
FIGS. 2A to 2D are cross-sectional views illustrating flexible touch display modules according to some other embodiments of the present disclosure.
Figure 2B:
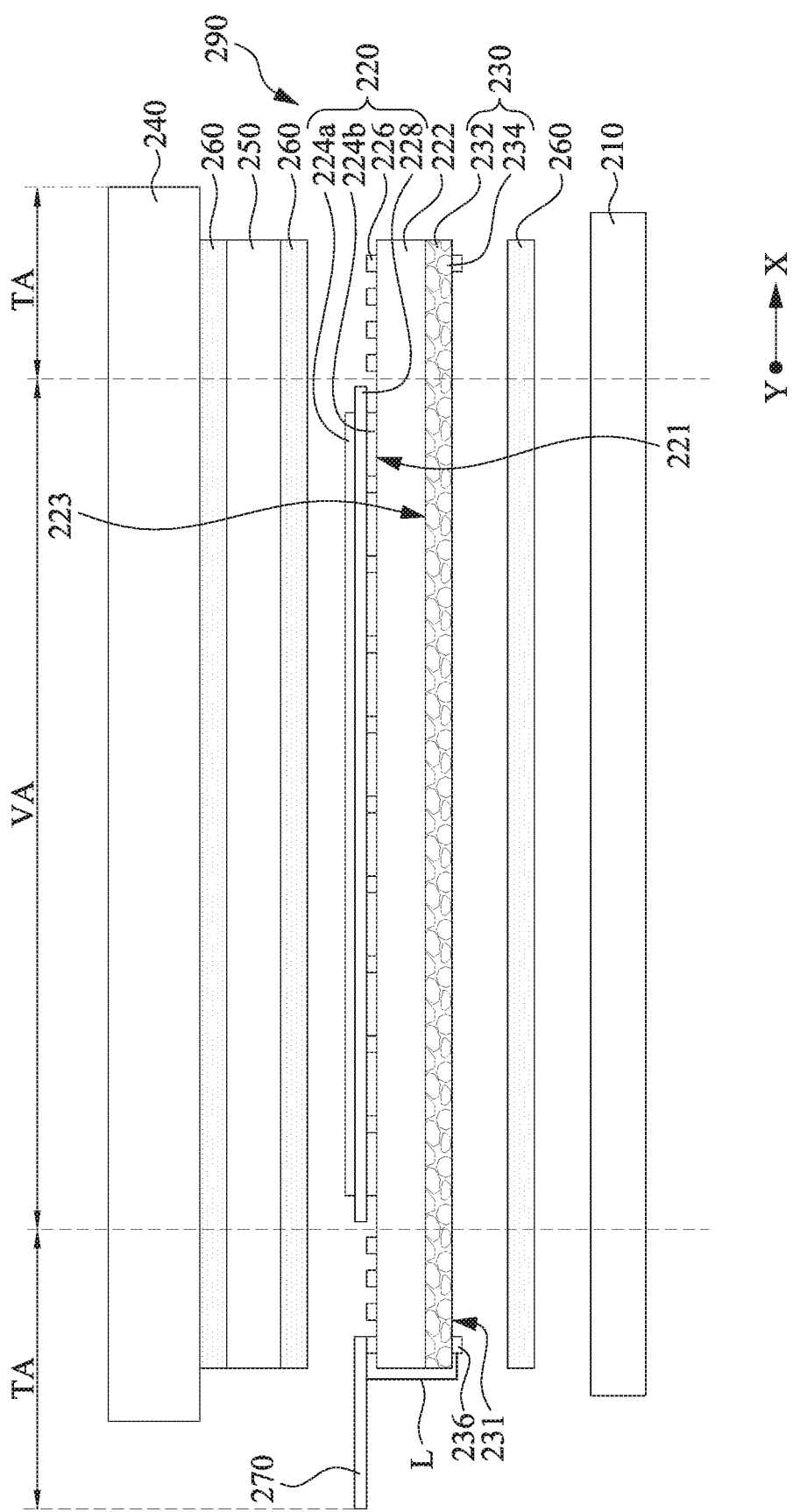

Please then refer to FIG. 2B. At least one difference between the flexible touch display module 200b shown in FIG. 2B and the flexible touch display module 200a shown in FIG. 2A is that the flexible touch display module 200b further includes a conductive coil 236 correspondingly disposed in the trace area TA. The conductive coil 236 is disposed on a surface 231 of the noise shielding layer 230 facing away from the substrate 222 to be directly in contact with the noise shielding layer 230. In addition, the conductive coil 236 is further electrically connected to the flexible circuit board 270 through the wire L and grounded. Through the above configuration, the noise shielding layer 230 can have a better electrostatic discharge protection effect, thereby providing a better and more stable noise shielding effect.

Figure 2C:
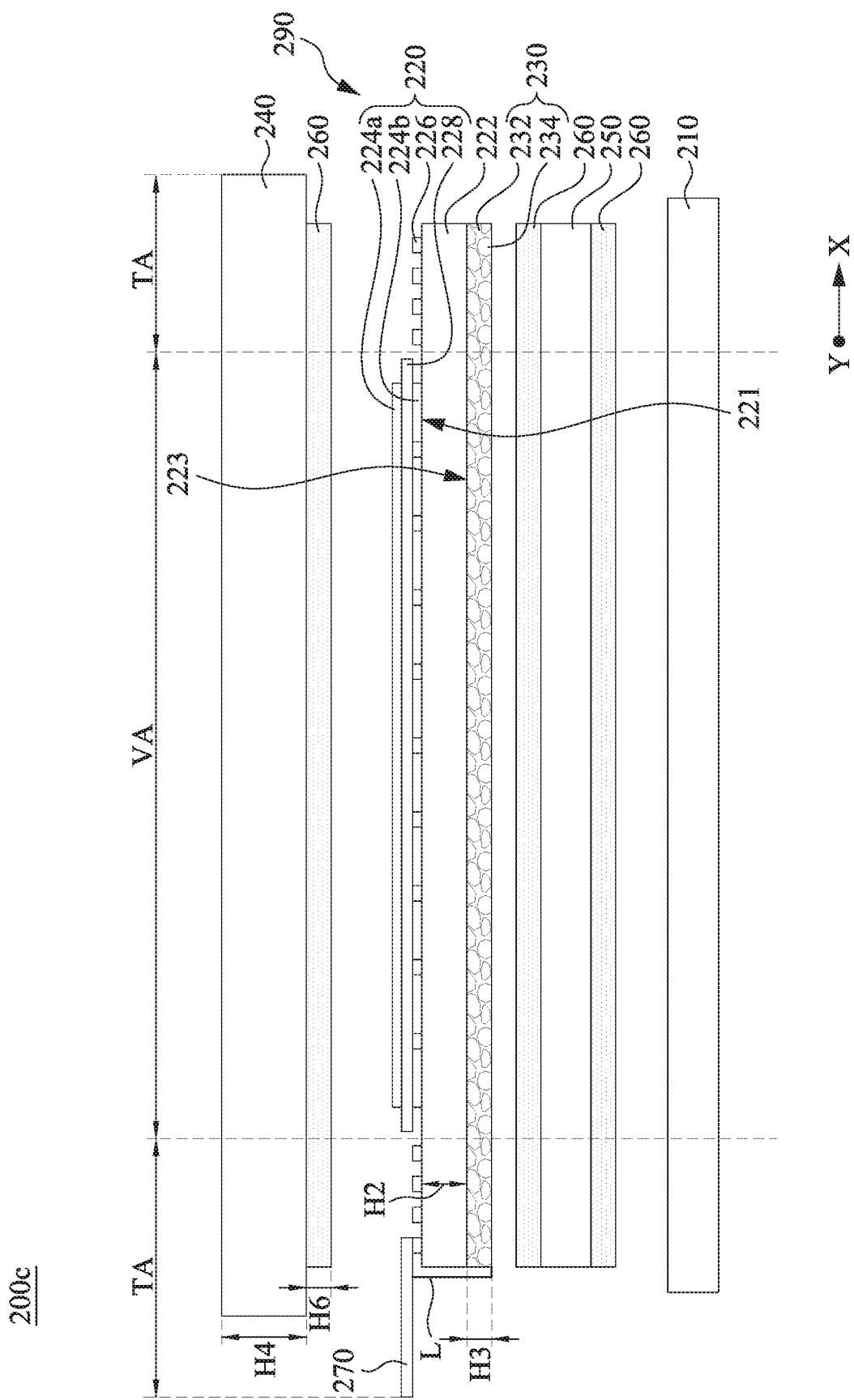

Please then refer to FIG. 2C. At least one difference between the flexible touch display module 200c shown in FIG. 2C and the flexible touch display module 200a shown in FIG. 2A is that the flexible touch sensor 290 (at least including the touch-sensing layer 220, the substrate 222, and the noise shielding layer 230) and the polarizing layer 250 in the flexible touch display module 200c are in different relative positions. Specifically, in the flexible touch display module 200c, the polarizing layer 250 is disposed between the flexible touch sensor 290 and the flexible display panel 210. Furthermore, the noise shielding layer 230 is disposed on the second surface 223 of the substrate 222 and faces toward the polarizing layer 250, such that the noise shielding layer 230 is disposed between the polarizing layer 250 and the touch-sensing layer 220. Through the above configuration, a distance between the flexible touch sensor 290 and the flexible display panel 210 can further be enlarged, thereby reducing the noise interference between the touch-sensing layer 220 and the flexible display panel 210 and better improving the report rate and the touch-response speed of the flexible touch display module 200c.

Figure 2D:
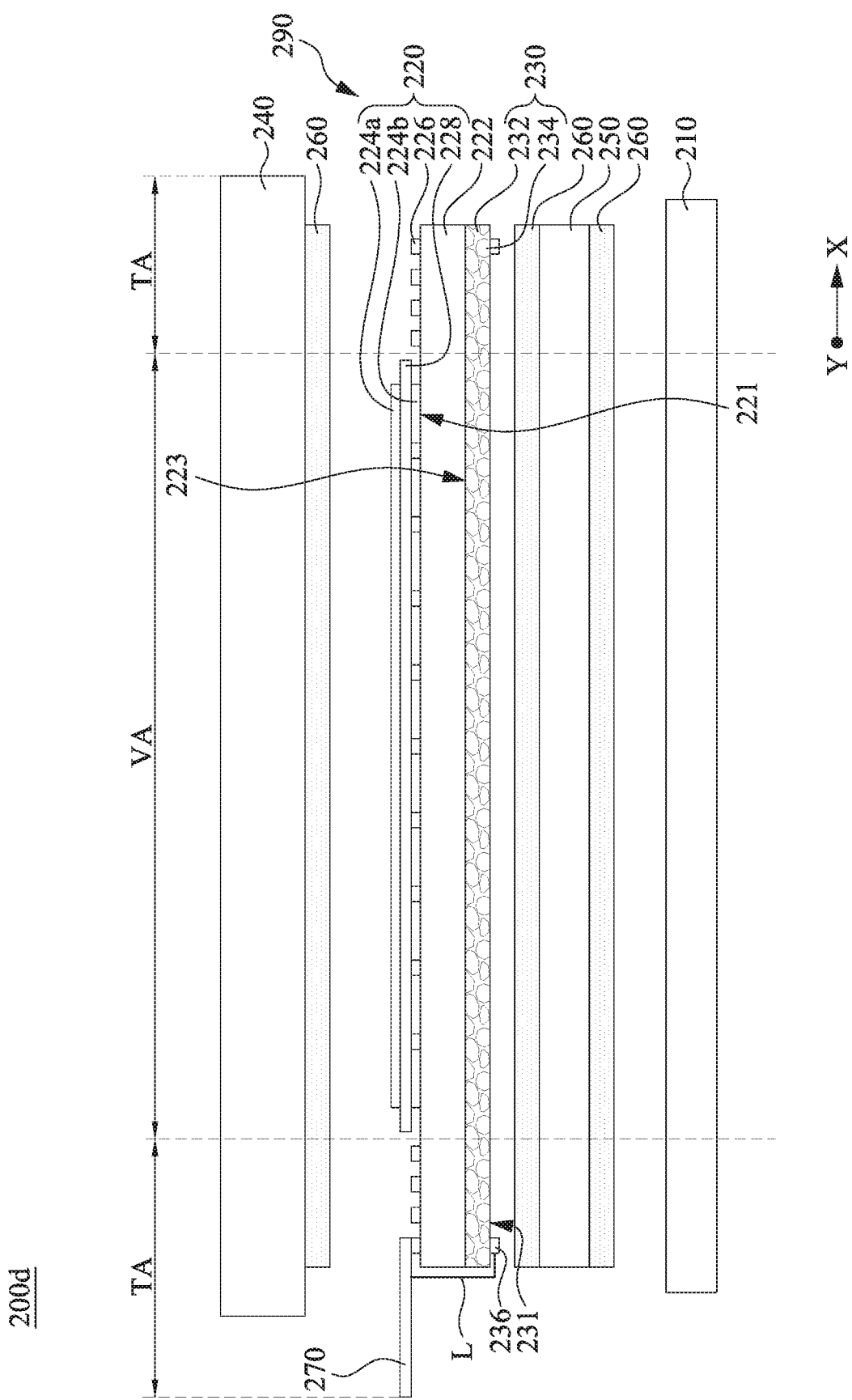

Please refer to FIG. 2D. At least one difference between the flexible touch display module 200d shown in FIG. 2D and the flexible touch display module 200c shown in FIG. 2C is that the flexible touch display module 200d further includes a conductive coil 236 correspondingly disposed in the trace area TA. The conductive coil 236 is disposed on a surface 231 of the noise shielding layer 230 facing away from the substrate 222 to be directly in contact with the noise shielding layer 230. In addition, the conductive coil 236 is further electrically connected to the flexible circuit board 270 through the wire L and grounded. Through the above configuration, the noise shielding layer 230 can have a better electrostatic discharge protection effect, thereby providing a better and more stable noise shielding effect.

FIGS. 3A to 3D are cross-sectional views illustrating flexible touch display modules 300a-300d according to some other embodiments of the present disclosure. The flexible touch display modules 300a-300d in FIGS. 3A to 3D have substantially identical structures as the flexible touch display modules 300a-300d in FIGS. 3A to 3D. At least one difference is that the touch-sensing layers 320 of the double-layer electrode structures and the substrate 322 in the flexible touch display modules 300a-300d are in different relative positions, which will be discussed in detail later in the following descriptions. Please first refer to FIG. 3A. The flexible touch display module 300a includes a flexible display panel 310, a touch-sensing layer 320, a substrate 322, a noise shielding layer 330, and a cover glass 340, in which the touch-sensing layer 320, the substrate 322, and the noise shielding layer 330 can be constructed as a flexible touch sensor 390 to provide a touch-sensing function. In terms of the entire flexible touch display module 300a, the flexible touch sensor 390 is disposed on the flexible display panel 310, and the noise shielding layer 330 is disposed between the flexible display panel 310 and the touch-sensing layer 320. As such, the noise shielding layer 330 can avoid the noise interference between the flexible display panel 310 and the touch-sensing layer 320, thereby improving the report rate and the touch-response speed of the flexible touch display module 300a. In addition, the cover glass 340 is disposed on the flexible touch sensor 390 to provide protection for the flexible touch sensor 390 and the flexible display panel 310. It should be understood that the flexible touch display module 300a of FIG. 3A and the flexible touch display module 200a of FIG. 2A have substantially identical component configuration/connection relationship, materials, and advantages, which will not be repeated hereinafter, and only the differences will be discussed in the following descriptions.

In some embodiments, the touch-sensing layer 320 of the double-layer electrode structure may include a first conductive electrode layer 324a and a second conductive electrode layer 324b disposed on two opposite sides of the substrate 322 (e.g., the side of the first surface 321 and the side of the second surface 323 of the substrate 322). The first conductive electrode layer 324a is correspondingly disposed in the visible area VA and on the first surface 321 of the substrate 322, and the second conductive electrode layer 324b is correspondingly disposed in the visible area VA, on the second surface 323 of the substrate 322, and between the substrate 322 and the noise shielding layer 330. The touch-sensing layer 320 further includes first traces 236a and second traces 326b, in which the first traces 236a are correspondingly disposed in the trace area TA and on the first surface 321 of the substrate 322 facing toward the cover glass 340 to be electrically connected to the first conductive electrode layer 324a, and the second traces 236b are correspondingly disposed in the trace area TA and on the second surface 323 of the substrate 322 facing toward the flexible display panel 310 to be electrically connected to the second conductive electrode layer 324b.

It should be further explained that, based on the relative position between the first conductive electrode layer 324a, the second conductive electrode layer 324b, the substrate 322, and the noise shielding layer 330 of this embodiment, the flexible touch sensor 390 of this embodiment may further include a carrier 380 configured to carry the noise shielding layer 330. Specifically, the noise shielding layer 330 is first formed on a surface of the carrier 380, and then the carrier 380 having the noise shielding layer 330 formed thereon is further attached to the substrate 322 having the first conductive electrode layer 324a and the second conductive electrode layer 324b formed thereon. In fact, the carrier 380 having the noise shielding layer 330 formed thereon can be attached to the substrate 322 having the first conductive electrode layer 324a and the second conductive electrode layer 324b formed thereon from a surface of the carrier 380 or a surface of the noise shielding layer 330 through an adhesive layer 360. As such, the noise shielding layer 330 can be electrically insulated from the second conductive electrode layer 324b at least through the adhesive layer 360 and further can be electrically insulated from the second conductive electrode layer 324b through the adhesive layer 360 and the carrier 380. In some embodiments, a total laminated thickness H7 of the carrier 380 and the noise shielding layer 330 may be between 5 μm and 10 μm, so as to provide the flexible touch display module 300a with the noise shielding function without affecting the flexibility and lightness of the flexible touch display module 300a. In detail, if the total laminated thickness H7 of the carrier 380 and the noise shielding layer 330 is greater than 10 μm, the flexibility of the flexible touch sensor 390 may be affected, causing the flexible touch display module 300a to be difficult to bend or easily broken while bending.

In some embodiments, the flexible touch display module 300a may further include a flexible circuit board 370, and the first conductive electrode layer 324a and the second conductive electrode layer 324b may be electrically connected to the flexible circuit board 370 respectively through the first traces 326a and the second traces 326b to further connect to external circuit elements, thereby transmitting the sensing signal of the touch-sensing layer 320 to external integrated circuits for subsequent processing. On the other hand, the noise shielding layer 330 can also be electrically connected to the flexible circuit board 370 through a wire L, so as to vent the noise signals or provide a stable ground signal through the flexible circuit board 370.

It should be understood that although it is not illustrated in the drawings, in the flexible touch display modules 100a-100d and 200a-200d of the aforementioned FIGS. 1A to 2D, the carrier 380 and the adhesive layer 360 can also be used to dispose and fix the noise shielding layer 330, so as to achieve a good noise shielding effect. In addition, a distance between the touch-sensing layer 320 and the flexible display panel 310 can further be enlarged by using the carrier 380 and the adhesive layer 360 to dispose and fix the noise shielding layer 330, and hence the noise interference between the touch-sensing layer 320 and the flexible display panel 310 can reduced to better improve the report rate and the touch-response speed of the flexible touch display module 300a.

Figure 3A:
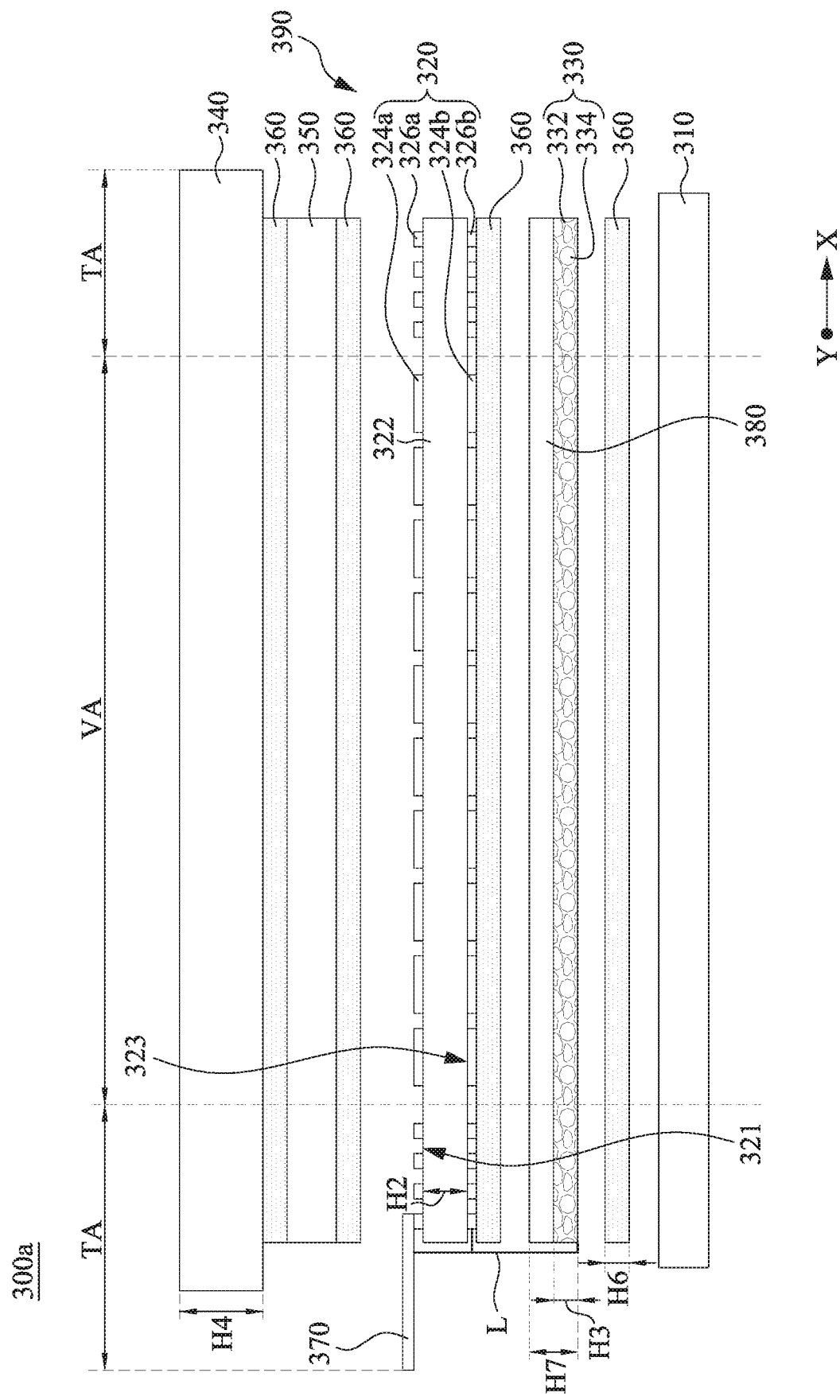
FIGS. 3A to 3D are cross-sectional views illustrating flexible touch display modules according to some other embodiments of the present disclosure.
Figure 3B:
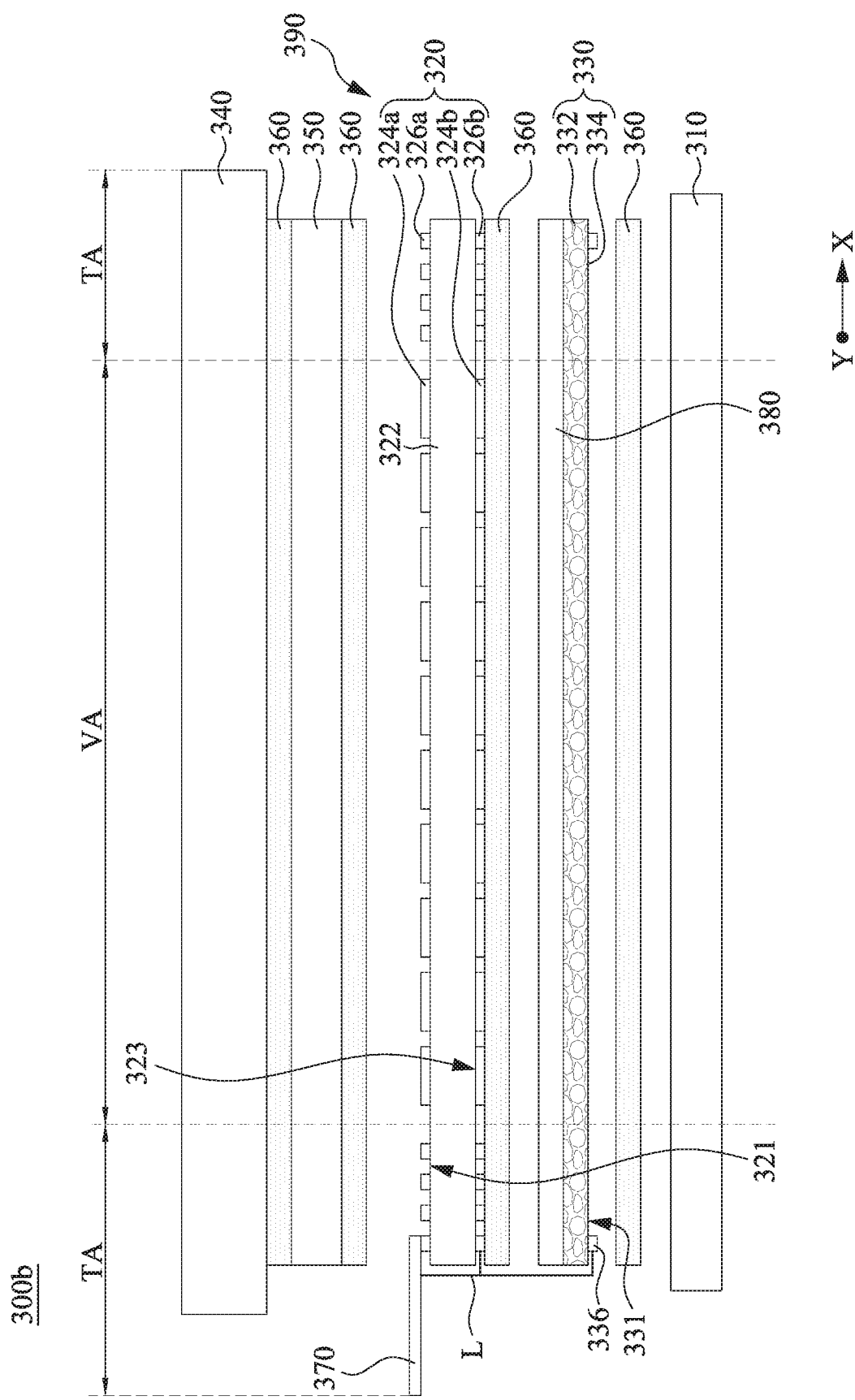

Please then refer to FIG. 3B. At least one difference between the flexible touch display module 300b shown in FIG. 3B and the flexible touch display module 300a shown in FIG. 3A is that the flexible touch display module 300b further includes a conductive coil 336 correspondingly disposed in the trace area TA, in which the conductive coil 336 is disposed on a surface of the noise shielding layer 330 facing away from the carrier 380 to be directly in contact with the noise shielding layer 330. In addition, the conductive coil 336 is further electrically connected to the flexible circuit board 370 through the wire L and grounded. Through the above configuration, the noise shielding layer 330 can have a better electrostatic discharge protection effect, thereby providing a better and more stable noise shielding effect.

Figure 3C:
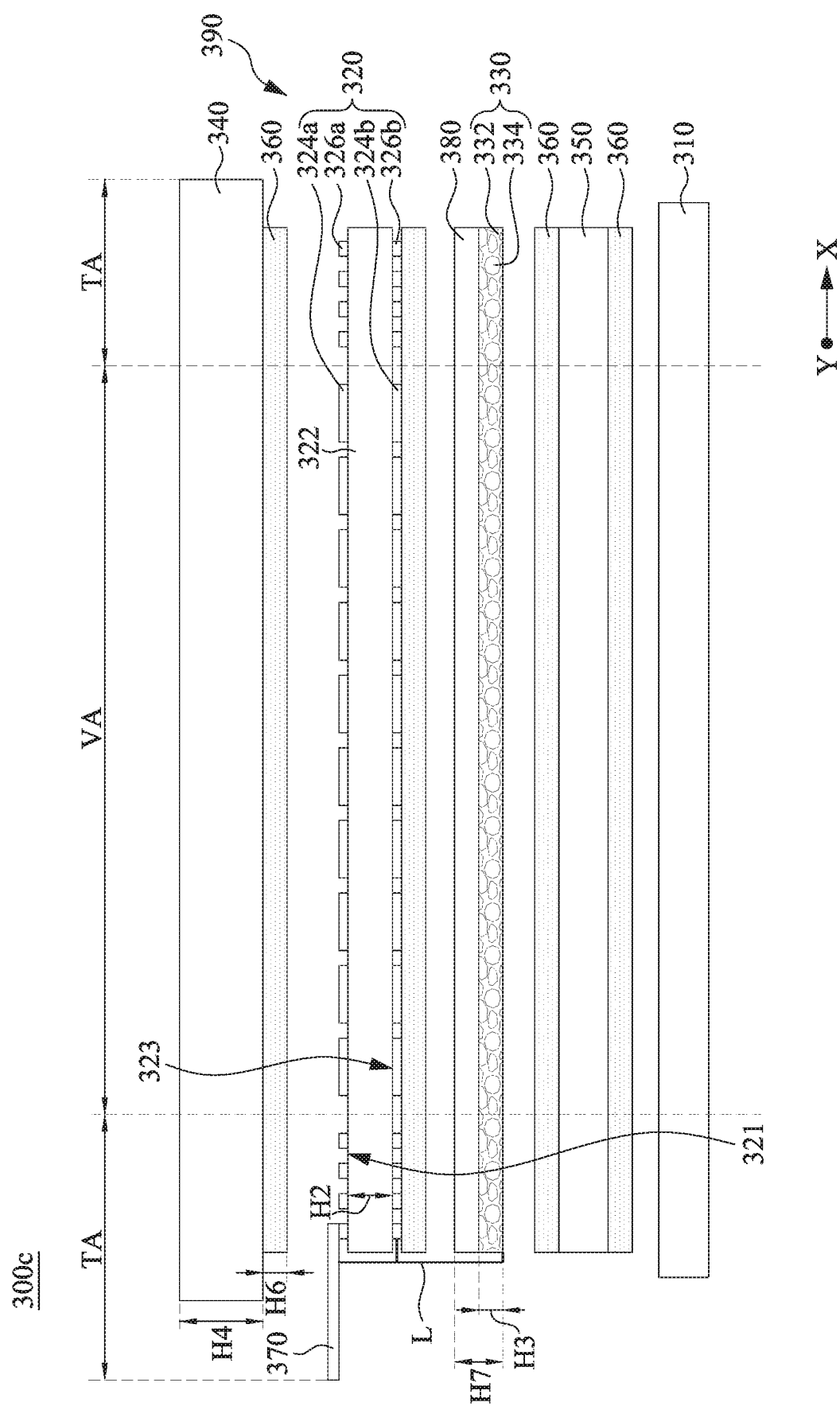

Please then refer to FIG. 3C. At least one difference between the flexible touch display module 300c shown in FIG. 3C and the flexible touch display module 300a shown in FIG. 3A is that the flexible touch sensor 390 (at least including the touch-sensing layer 320, the substrate 322, and the noise shielding layer 330) and the polarizing layer 350 in the flexible touch display module 300c are in different relative positions. Specifically, in the flexible touch display module 300c, the polarizing layer 350 is disposed between the flexible touch sensor 390 and the flexible display panel 310, and the noise shielding layer 230 is disposed between the polarizing layer 350 and the touch-sensing layer 320. Through the above configuration, a distance between the flexible touch sensor 390 and the flexible display panel 310 can further be enlarged, thereby reducing the noise interference between the touch-sensing layer 320 and the flexible display panel 310 and better improving the report rate and the touch-response speed of the flexible touch display module 300c.

Figure 3D:
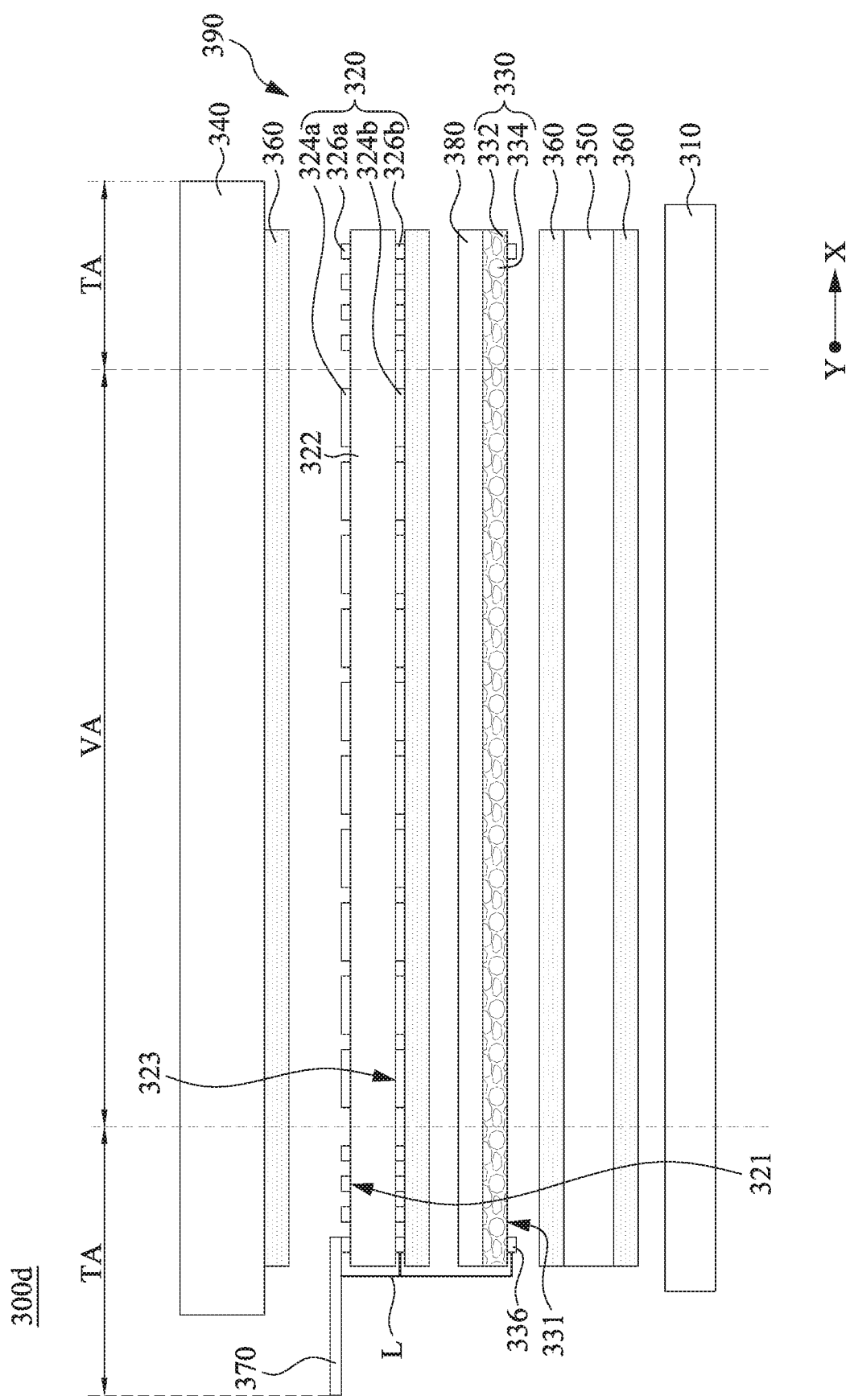

Please refer to FIG. 3D. At least one difference between the flexible touch display module 200d shown in FIG. 3D and the flexible touch display module 300c shown in FIG. 3C is that the flexible touch display module 300d further includes a conductive coil 336 correspondingly disposed in the trace area TA. The conductive coil 336 is disposed on a surface of the noise shielding layer 330 facing away from the carrier 380 to be directly in contact with the noise shielding layer 330. In addition, the conductive coil 336 is further electrically connected to the flexible circuit board 370 through the wire L and grounded. Through the above configuration, the noise shielding layer 330 can have a better electrostatic discharge protection effect, thereby providing a better and more stable noise shielding effect.

According to the aforementioned embodiments of the present disclosure, the flexible touch sensor is designed to have the noise shielding layer, and the flexible touch display module is integrated with the above flexible touch sensor, such that the noise shielding layer is disposed between the flexible display panel and the flexible touch sensor. Since the noise shielding layer includes the matrix and the metal nanowires distributed in the matrix, the noise shielding layer can be bent, and the conductivity of the noise shielding layer will not be affected after multiple times of bending, thereby maintaining a good noise shielding effect to avoid the noise interference between the flexible display panel and the touch-sensing layer and improving the report rate and the touch-response speed of the flexible touch sensor. In addition, through the configuration of the noise shielding layer, the thickness of each layer in the flexible touch display module can be reduced, thereby improving the flexibility and the lightness of the flexible touch display module.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A flexible touch sensor having a visible area and a trace area surrounding the visible area, comprising:
   a substrate having a first surface and a second surface facing away from the first surface;
   a touch-sensing layer disposed on the first surface of the substrate;
   a noise shielding layer disposed on the second surface of the substrate;
   a flexible circuit board electrically connected to the touch-sensing layer and the noise shielding layer, wherein the flexible circuit board is disposed above a trace of the touch-sensing layer disposed in the trace area; and
   a wire extending from the noise shielding layer to the flexible circuit board;
   wherein the noise shielding layer comprises a matrix and a plurality of metal nanowires distributed in the matrix.

2. The flexible touch sensor of claim 1, wherein a thickness of the noise shielding layer is between 30 nm and 50 nm.

3. The flexible touch sensor of claim 1, wherein a thickness of the substrate is between 5 μm and 30 μm.

4. The flexible touch sensor of claim 1, wherein the touch-sensing layer comprises:
   a conductive electrode layer correspondingly disposed in the visible area and having a single-layer electrode structure;
   wherein the trace is electrically connected to the conductive electrode layer.

5. The flexible touch sensor of claim 1, wherein the touch-sensing layer comprises:
   a first conductive electrode layer correspondingly disposed in the visible area;

a second conductive electrode layer correspondingly disposed in the visible area and on the first surface of the substrate; and an insulating layer disposed between the first conductive electrode layer and the second conductive electrode layer;

wherein the first conductive electrode layer, the second conductive electrode layer, and the insulating layer are disposed on a same side of the substrate.

6. The flexible touch sensor of claim 5, wherein the trace is disposed on the first surface of the substrate to be electrically connected to the first conductive electrode layer and the second conductive electrode layer.

7. The flexible touch sensor of claim 1, wherein the touch-sensing layer comprises:

a first conductive electrode layer correspondingly disposed in the visible area and on the first surface of the substrate; and a second conductive electrode layer correspondingly disposed in the visible area, on the second surface of the substrate, and between the substrate and the noise shielding layer.

8. The flexible touch sensor of claim 7, wherein:

the trace is disposed on the first surface of the substrate to be electrically connected to the first conductive electrode layer; and the touch-sensing layer further comprises a second trace correspondingly disposed in the trace area and on the second surface of the substrate to be electrically connected to the second conductive electrode layer.

9. The flexible touch sensor of claim 1, further comprising a carrier, wherein the noise shielding layer is disposed on a surface of the carrier, and the carrier or the noise shielding layer is disposed on the second surface of the substrate through an adhesive layer.

10. The flexible touch sensor of claim 9, wherein a total laminated thickness of the carrier and the noise shielding layer is between 5 μm and 10 μm.

11. The flexible touch sensor of claim 1, further comprising a conductive coil correspondingly disposed in the trace area and on a surface of the noise shielding layer, wherein the conductive coil is directly in contact with the noise shielding layer and electrically connected to the flexible circuit board.

12. A flexible touch display module, comprising:
a flexible display panel; and
the flexible touch sensor of claim 1 disposed on the flexible display panel.

13. The flexible touch display module of claim 12, further comprising a cover glass disposed on the flexible touch sensor, wherein a thickness of the flexible touch sensor is between 50 μm and 125 μm.

14. The flexible touch display module of claim 13, further comprising a polarizing layer disposed between the flexible display panel and the flexible touch sensor or between the flexible touch sensor and the cover glass.

15. A flexible touch display module, comprising:
a flexible display panel; and
the flexible touch sensor of claim 2 disposed on the flexible display panel.

16. A flexible touch display module, comprising:
a flexible display panel; and
the flexible touch sensor of claim 3 disposed on the flexible display panel.

17. A flexible touch display module, comprising:
a flexible display panel; and
the flexible touch sensor of claim 4 disposed on the flexible display panel.

18. A flexible touch display module, comprising:
a flexible display panel; and
the flexible touch sensor of claim 5 disposed on the flexible display panel.

19. A flexible touch display module, comprising:
a flexible display panel; and
the flexible touch sensor of claim 6 disposed on the flexible display panel.

20. A flexible touch display module, comprising:
a flexible display panel; and
the flexible touch sensor of claim 7 disposed on the flexible display panel.

\* \* \* \* \*